(12) United States Patent
Higo et al.

(10) Patent No.: US 8,674,236 B2
(45) Date of Patent: Mar. 18, 2014

(54) WIRING SUBSTRATE AND METHOD OF MANUFACTURING THE SAME

(75) Inventors: Kazunaga Higo, Iida (JP); Hidemasa Igarashi, Komaki (JP); Masatsune Arakawa, Kani (JP); Erina Yamada, Komaki (JP); Kenji Suzuki, Iwakura (JP); Tomohito Ando, Fuso-cho (JP); Hironori Sato, Kasugai (JP); Takuya Torii, Komaki (JP)

(73) Assignee: NGK Spark Plug Co., Ltd., Nagoya (JP)

( * ) Notice: Subject to any disclaimer, the term of this patent is extended or adjusted under 35 U.S.C. 154(b) by 242 days.

(21) Appl. No.: 13/368,840

(22) Filed: Feb. 8, 2012

(65) Prior Publication Data

US 2012/0205142 A1 Aug. 16, 2012

(30) Foreign Application Priority Data

Feb. 9, 2011 (JP) .................................. 2011-26474
Jan. 6, 2012 (JP) .................................... 2012-1396

(51) Int. Cl.
*H05K 1/11* (2006.01)
*H05K 3/02* (2006.01)

(52) U.S. Cl.
USPC ........................................... 174/262; 29/847

(58) Field of Classification Search
USPC .......................... 174/262–266; 361/792–795; 29/846–847
See application file for complete search history.

(56) References Cited

U.S. PATENT DOCUMENTS

| 6,217,987 | B1* | 4/2001 | Ono et al. ..................... 428/209 |
| 2006/0000640 | A1* | 1/2006 | Fushie et al. .................. 174/262 |
| 2009/0197109 | A1 | 8/2009 | Kawaguchi et al. |
| 2012/0103680 | A1* | 5/2012 | Shirai et al. ................... 174/266 |
| 2012/0152600 | A1* | 6/2012 | Nishioka et al. .............. 174/258 |
| 2012/0307469 | A1* | 12/2012 | Oka et al. ...................... 361/782 |
| 2013/0068510 | A1* | 3/2013 | Kwon et al. ................... 174/255 |

FOREIGN PATENT DOCUMENTS

JP 2010-109308 A 5/2010

* cited by examiner

*Primary Examiner* — Jeremy C Norris
(74) *Attorney, Agent, or Firm* — Stites & Harbison PLLC; Jeffrey A. Haeberlin

(57) ABSTRACT

A wiring substrate is configured such that each of laminate portions provided above and below a substrate core includes insulating layers and conductor layers stacked alternately. Of the conductor layers of the laminate portions, signal line layers are treated with a silane coupling treatment, which is a surface modification treatment, so that each signal line comprises a flat surface. A roughening treatment is performed on the remaining conductor layers of the laminate portions such that the surfaces of these layers are roughened. This structure provides an advantage when high-frequency signals are transmitted through the signal line layers. That is, when each signal line comprises a flat surface, an increase in conductor loss due to the skin effect can be prevented. In addition, by means of chemical bonding attained through the silane coupling treatment, the reliability of adhesion between the signal line layers and the insulating layer is sufficiently attained.

15 Claims, 11 Drawing Sheets

WIRING SUBSTRATE AND METHOD OF MANUFACTURING THE SAME

BACKGROUND OF THE INVENTION

1. Field of the Invention

The present invention relates to a multi-layer wiring substrate having a laminate portion in which insulating layers and conductor layers are stacked alternately, and more particularly to a wiring substrate suitable for transmission of high-frequency signals.

2. Description of Related Art

Conventionally, a wiring substrate which includes a substrate core and laminate portions provided on opposite sides of the substrate core and each including insulating layers and conductor layers stacked alternately has been widely used as a package on which a semiconductor chip or the like is mounted. In a process of manufacturing a wiring substrate having such a structure, conductor layers formed of metal such as copper and insulating layers formed of resin must be stacked such that a sufficient degree of adhesion is ensured between them. If a sufficient degree of adhesion is not secured between each conductor layer and the corresponding insulating layer adjacent thereto, for example, heating at the time of re-flow may cause defects such as partial bulging or separation at the interface between each conductor layer and the corresponding insulating layer adjacent thereto. In order to prevent occurrence of such a defect, conventionally, there have been proposed various methods for treating the surfaces of conductor layers which adhere to corresponding insulating layers in order to enhance adhesion reliability (see, for example, Patent Document 1). In general, in the case where a conductor layer has a solid conductor portion to be connected to a power supply voltage or a ground potential, the problem of poor adhesion reliability becomes remarkable. An effective measure for enhancing adhesion reliability is performing a roughening treatment on the surface of the conductor layer. That is, when the surface of the conductor layer is roughened through etching or the like, fine protrusions and recesses are formed on the surface, whereby an anchor effect is attained. Thus, the reliability of adhesion between the conductor layer and the corresponding insulating layer can be enhanced.

RELATED ART DOCUMENTS

Patent Documents

Patent Document 1 is Japanese Patent Application No. 2010-109308.

BRIEF SUMMARY OF THE INVENTION

In recent years, a wiring substrate which can transmit high-frequency signals has been demanded in order to realize high-speed operations in various circuit systems. In general, in the case where a high-frequency signal is transmitted through a conductor layer of a wiring substrate, there occurs a skin effect; i.e., concentration of current in the vicinity of the surface of the conductor. The higher the frequency, the greater the conductor loss produced as a result of the skin effect. In the case where a roughening treatment is performed on the surface of such a conductor layer as described above, because of the skin effect, current flows intensively through the uneven portion at the surface of the conductor, whereby conductor loss increases significantly. Thus, transmission characteristics associated with transmission of high-frequency signals through the wiring substrate deteriorate, which hinders application of such a wiring substrate to desired high-frequency applications. One possible measure for mitigating the performance-related problem caused by the skin effect is maintaining the flat surface of each conductor layer, without roughening it, at the time of manufacture of a wiring substrate. However, in such a case, adhesion reliability cannot be secured, and occurrence of defects during manufacture cannot be avoided. Therefore, such measure is not realistic. As described above, the conventional wiring substrate structure has a problem in that securement of satisfactory high-frequency characteristics associated with transmission of high-frequency signals and securement of adhesion reliability at the time of manufacture cannot be realized simultaneously.

The present invention has been accomplished in order to solve these problems, and its objective is to realize a structure for a wiring substrate which can transmit high-frequency signals, the structure securing high adhesion reliability, while preventing an increase in conductor loss caused by the skin effect, to thereby secure satisfactory high-frequency characteristics.

A means (Means 1) for solving the above problems is a wiring substrate comprising a laminate portion including insulating layers and conductor layers stacked alternately, wherein at least one of the conductor layers is a signal line layer, through which a signal is to be transmitted, comprising a flat surface having undergone a surface modification treatment; and each of the conductor layers other than the signal line layer comprise a roughened surface.

According to the wiring substrate of the present invention, of the conductor layers of the laminate portion, each of the conductor layers other than the signal line layer has a roughened surface treated with a roughening treatment, and the signal line layer has a flat surface treated with a surface modification treatment rather than the roughening treatment. This structure provides advantageous effects. That is, in the laminate portion composed of the insulating layers and the conductor layers, a roughening treatment is performed on the conductor layers other than the signal line layer. Thus, adhesion is secured between the conductor layers and the insulating layers by the anchor effect of protrusions and depressions on the surfaces of the conductor layers. In addition, through performance of a proper surface modification treatment on the signal line layer, adhesion between the surface of the signal line layer and the adjacent insulating layer is secured through chemical bonding between the surface of the signal line layer and the insulating layer. Therefore, it is possible to prevent occurrence of deficiencies such as surface bulging or separation of each conductor layer, which would otherwise occur when the wiring substrate is heated. Also, even in the case where the signal line layer has a conductor pattern for high-frequency signals, current concentrates at the flat conductor surface having no uneven portion (protrusions and depressions) due to the skin effect. Therefore, conductor loss can be reduced, and satisfactory high-frequency characteristics can be maintained.

A typical example of the surface modification treatment performed on the signal line layer is a silane coupling treatment performed through use of a silane coupling agent. The silane coupling agent is an organic silane compound having an organic functional group which reacts with an organic substance. When the silane coupling treatment is performed on the signal line layer, the silane coupling agent is applied to the surface of the signal line layer to a predetermined thickness, and a resin is applied onto the signal line layer in this state. As a result, the organic functional group of the silane coupling agent reacts with the organic functional group of the resin material, whereby chemical coupling is produced on the conductor surface, and the conductor surface is modified. Thus, the signal line layer and the adjacent insulating layer can be bonded at the interface therebetween. No particular limitation is imposed on a method of preparing the silane coupling agent and additives thereof, and the preparation method and additives can be properly selected in accordance with treatment conditions.

The signal line layer can be formed to have any of various configurations. For example, as viewed in a cross section of the signal line layer taken along a thickness direction thereof, a surface of the signal line layer in contact with an insulating layer which is adjacently located on one side (i.e., a first side) of the signal line layer is not the flat surface, and a surface of the signal line layer in contact with an insulating layer which is adjacently located on the other side (i.e., a second side) of the signal line layer is the flat surface. In this case, an example of a surface which is made flat includes a surface of the signal line layer that is in contact with an insulating layer adjacent to the signal line layer. The surface may include opposite side surfaces of each conductor trace of the signal line layer. Thus, even though one of the surfaces (generally, of four side surfaces) of each conductor trace through which a high-frequency signal is to be transmitted is a roughened surface, the remaining surfaces are treated with a surface modification treatment. Therefore, it is possible to simplify the surface modification step in a wiring substrate manufacturing process, without impairing the effect of preventing deterioration of high-frequency characteristics, which would otherwise occur due to the skin effect.

Although no particular limitations are imposed on the dimensional conditions of the signal line layer, preferably, the surface roughness Ra of the flat surface is set to be less than 0.1 μm, and the surface roughness Ra of the roughened surface of each of the conductor layers other than the signal line layer is set to 0.1 μm or greater. In this case, the surface roughness Ra of the flat surface is desirably set to such a value that the surface roughness Ra can be substantially considered to be 0 μm.

In the wiring substrate of the present invention, the insulating layers adjacent to the signal line layer may be formed through use of a material which is smaller in relative dielectric constant than the remaining insulating layer(s). By virtue of this configuration, high-frequency signals are transmitted through signal lines in a state in which a material which is low in dielectric constant and which has good high-frequency characteristics is disposed around the signal lines. Together with the effect of the surface modification treatment, use of such a material further improves the high-frequency characteristics. Notably, the same effect can be expected even in the case where not only the relative dielectric constant of the material of the insulating layers, but also the tan δ (electric loss tangent) of the material of the insulating layers is decreased.

The wiring substrate of the present invention can be formed to have any of various configurations. For example, the wiring substrate may include a substrate core and be configured such that the laminate portion is formed on each of opposite sides of the substrate core; and first and second signal line layers disposed in the respective laminate portions, wherein the substrate core intervenes between the first and second signal line layers. For example, a first signal line layer may be formed at a predetermined layer position of the laminate portion located on one side of the substrate core, and a second signal line layer may be formed at a predetermined layer position of the laminate portion located on the other side of the substrate core such that the second signal line layer becomes symmetric with the first signal line.

A second mode of the present invention which can solve the above-described problem is a wiring substrate comprising a laminate portion composed of insulating layers and conductor layers stacked alternately, wherein at least one of the conductor layers is a first conductor layer that is a signal line layer through which a signal is to be transmitted, the first conductor layer that is a signal line layer comprising an unroughened surface having undergone a surface modification treatment; and each of the conductor layers other than the first conductor layer has a roughened surface, wherein the cross-sectional shape of the first conductor layer has a curved portion such that a central portion of an upper surface of the first conductor layer projects upward in relation to edge portions thereof.

According to the second mode of the wiring substrate of the present invention, since the first conductor layer has a rounded cross-sectional shape such that a central portion of the first conductor layer projects upward, stress which is likely to concentrate at corner portions of the cross-sectional shape can be mitigated, whereby deficiencies such as resin cracking or the like near the corner portions can be reliably prevented.

One example of a method of manufacturing the wiring substrate of the present invention comprises a first conductor layer forming step of forming, on a surface of a first insulating layer of the laminate portion, a first conductor layer that is as a signal line layer through which a signal is to be transmitted; a surface modification step of performing a surface modification treatment on the first conductor layer that is the signal line layer such that the signal line layer has a flat surface; an insulating layer forming step of forming a second insulating layer which covers an upper portion of the signal line layer; a second conductor layer forming step of forming a second conductor layer of the laminate portion; and a roughening step of performing a roughening treatment on surfaces of the second conductor layer. In this case, preferably, the surface modification treatment is a silane coupling treatment that uses a silane coupling agent and forms the flat surface.

Another example of a method of manufacturing the wiring substrate of the present invention comprises a first conductor layer forming step of forming, on a surface of a first insulating layer of the laminate portion, a first conductor layer that is a signal line layer through which a signal is to be transmitted; a surface modification step of performing a surface modification treatment on the first conductor layer so as to form an unroughened surface thereon; an insulating layer forming step of forming a second insulating layer which covers an upper portion of the first conductor layer; a second conductor layer forming step of forming a second conductor layer of the laminate portion; and a roughening step of performing a roughening treatment on surfaces of the second conductor layer, wherein the first conductor layer forming step includes a plating step of performing electro copper plating using copper sulfate on the surface of the first insulating layer to thereby form the first conductor layer whose cross-sectional shape has a curved portion such that a central portion of an upper surface of the first conductor layer projects upward in relation to edge portions thereof.

As described above, according to the present invention, in a wiring substrate which can transmit high-frequency signals, a surface modification treatment is performed on the signal line layer of the laminate portion to thereby form a flat surface thereon, and a roughening treatment is performed on the remaining conductor layers to thereby form roughened surfaces. Therefore, when a high-frequency signal is transmitted through the signal line layer, current which concentrates at the conductor surface due to the skin effect flows along the flat surface, and does not flow through an uneven portion. Therefore, an increase of conductor loss of the signal line layer can be prevented, and transmission characteristics for high-frequency signals can be improved. Also, the reliability of adhesion between the signal line layer and the adjacent insulating layer is secured by the surface modification treatment performed on the signal line layer, and the reliability of adhesion between the remaining conductor layers and the corresponding insulating layers can be secured by the anchor effect of the roughened surfaces of the remaining conductor layers. Therefore, it is possible to reliably prevent deficiencies such as bulging and separation at the interfaces between the conductor layers and the insulating layers. Moreover, since the first conductor layer of the laminate portion, including the signal line layer, is formed to have a curved cross-sectional shape (so-called convex shape) such that a central portion of the upper surface projects upward in relation to edge portions thereof, resin cracking or the like, which are caused by stress concentration at corner portions, can be prevented, whereby the reliability of the wiring substrate can be enhanced.

BRIEF DESCRIPTION OF THE DRAWINGS

Illustrative aspects of the invention will be described in detail with reference to the following figures wherein.

DETAILED DESCRIPTION OF EXEMPLARY EMBODIMENTS OF THE INVENTION

Preferred embodiments of the present invention will now be described with reference to the drawings. Although two embodiments of the present invention will be described below, the present invention is not limited to these embodiments.

Figure 1:
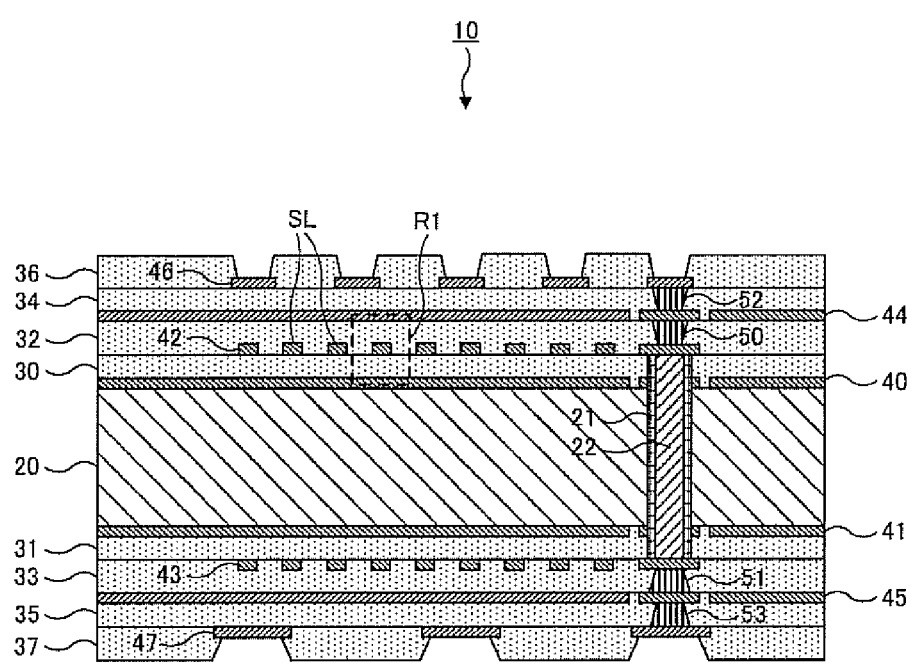
FIG. 1 is a schematic sectional view showing a cross-section of a wiring substrate of a first embodiment.

The structure of a wiring substrate 10 according to a first embodiment of the present invention will be described with reference to FIG. 1, which schematically shows the cross-sectional structure of the wiring substrate 10 of the first embodiment. As shown in FIG. 1, the wiring substrate 10 includes a plate like substrate core 20, which supports the entire the substrate, and laminate portions disposed on opposite sides of the substrate core 20. Each of the laminate portions includes insulating layers and conductor layers stacked alternately. The wiring substrate 10 of the first embodiment is used as, for example, a package on which components such as a semiconductor chip are mounted for connection to an external substrate member.

The substrate core 20 is formed of, for example, epoxy resin containing glass fibers. A conductor layer 40 is formed on the upper surface of the substrate core 20, and a conductor layer 41 is formed on the lower surface of the substrate core 20. Each of the conductor layers 40 and 41 has a solid conductor portion to be connected to a fixed potential such as power supply voltage or ground potential. For example, a laminate plate having copper-clad opposite surfaces can be used as the substrate core 20 having the above-described structure.

Insulating layers 30, 32, 34, and a solder resist layer 36 are stacked in this sequence on the upper side of the conductor layer 40 of the substrate core 20. Insulating layers 31, 33, 35, and a solder resist layer 37 are stacked in this sequence on the lower side of the conductor layer 41 of the substrate core 20. The substrate core 20, the upper and lower conductor layers 40, 41, and the insulating layers 30, 31 have a through hole conductor 21 formed at a predetermined position such that the through hole conductor 21 extends therethrough in the stacking direction. The interior of the through hole conductor 21 is filled with a plug 22 formed of glass epoxy or the like. Notably, in FIG. 1, only one through hole conductor 21 is shown; however, a plurality of through hole conductors 21 may be formed in different portions of the substrate core 20.

A signal line layer 42, which is a conductor layer, is formed on the surface of the insulating layer 30. This signal line layer 42 includes a large number of signal lines SL for transmitting high-frequency signals. Also, a signal line layer 43, which is a conductor layer, is formed on the surface of the insulating layer 31. This signal line layer 43 has the same structure as the above-described signal line layer 42. The upper end and lower end of the through hole conductor 21 are connected to conductor traces of the signal line layers 42 and 43, respectively. The wiring substrate 10 of the first embodiment is characterized in that, in order to attain satisfactory high-frequency characteristics and satisfactory adhesion reliability, a silane coupling treatment is performed on the signal line layers 42 and 43 so as to form flat surfaces. The specific structure and action of the signal line layers 42 and 43 will be described later.

A conductor layer 44 is formed on the surface of the insulating layer 32, and a conductor layer 45 is formed on the surface of the insulating layer 33. Each of these conductor layers 44 and 45 has a solid conductor portion to be connected to a fixed potential such as power supply voltage or ground potential. Furthermore, a plurality of terminal pads 46 are formed on the surface of the insulating layer 34, and a plurality of openings are formed in the solder resist layer 36 so as to expose the plurality of terminal pads 46. Meanwhile, a plurality of terminal pads 47 having a relatively large size are formed on the surface of the insulating layer 35, and a plurality of openings are formed in the solder resist layer 37 so as to expose the plurality of terminal pads 47.

A via conductor 50 is provided in the insulating layer 32 at a predetermined position so as to connect the signal line layer 42 and the conductor layer 44 in the stacking direction. Also, a via conductor 52 is provided in the insulating layer 34 at a predetermined position so as to connect the conductor layer 44 and the terminal pad 46 in the stacking direction. Similarly, via conductors 51 and 53, which correspond to the via conductors 50 and 52, are provided in the insulating layers 33 and 35 on the opposite side. Notably, in FIG. 1, each of the via conductors 50 to 53 are provided singly; however, no limitation is imposed on their numbers, and each of the via conductors 50 to 53 may be provided plurally.

In the case where a semiconductor chip, for example, is connected to an external substrate member via the wiring substrate 10 shown in FIG. 1, a plurality of pads of the semiconductor chip are bonded to the terminal pads 46, and the external substrate member is bonded to the plurality of terminal pads 47 on the lower side via a plurality of solder balls. In such a case, in the cross-sectional structure shown in FIG. 1, electrical connection is established between the semiconductor chip and the external substrate member via the plurality of terminal pads 46, the via conductor 52, the conductor layer 44, the via conductor 50, the signal line layer 42, the through hole conductor 21, the signal line layer 43, the via conductor 51, the conductor layer 45, the via conductor 53, and the plurality of terminal pads 47.

Figure 2:
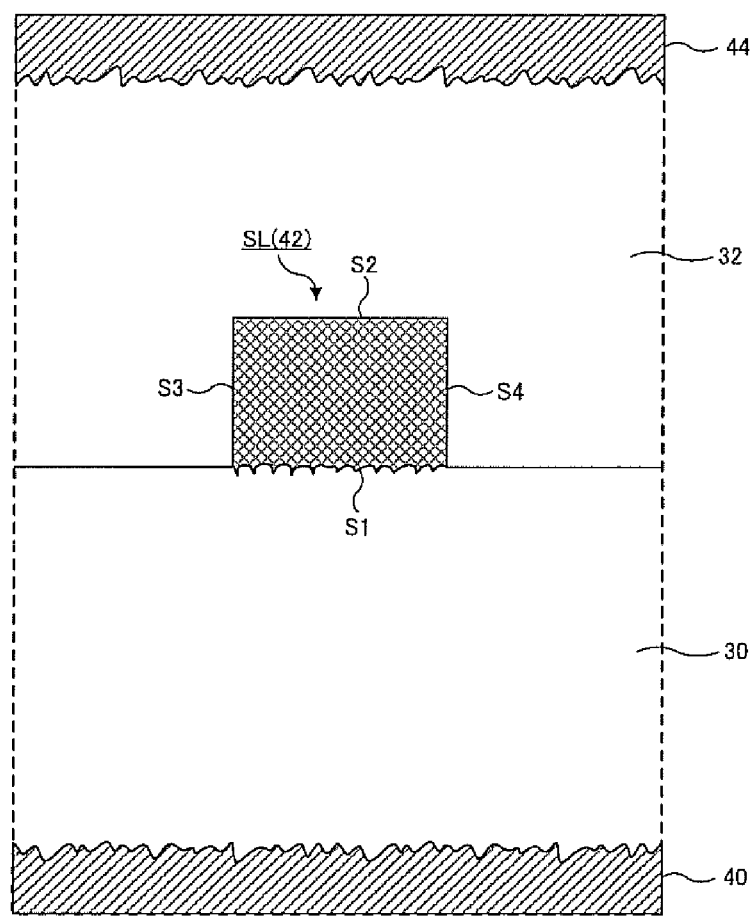
FIG. 2 is a schematic enlarged view showing a portion of the cross-section shown in FIG. 1 that includes one signal line of a signal line layer.

Next, there will be described the specific structure and action of the signal line layer 42 of the wiring substrate 10 according to the first embodiment. FIG. 2 is an enlarged view schematically showing a partial region R1 of the cross-sectional structure shown in FIG. 1, which includes one signal line SL of the signal line layer 42. Notably, since the signal line layer 43 on the lower side of FIG. 1 is identical in structure with the signal line layer 42 on the upper side, its description will not be provided. The signal line SL shown in FIG. 2 has a generally rectangular shape as viewed from a cross section perpendicular to the direction it extends in, and is formed into a shape such that the signal line SL is surrounded by a bottom surface S1, a top surface S2, and opposite side surfaces S3, S4. The bottom surface S1 of the signal line SL is in contact with the lower-side insulating layer 30, and the top surface S2 and the side surfaces S3, S4 are in contact with the upper-side insulating layer 32. Also, the conductor layer 40 of the substrate core 20 is disposed under the signal line SL with the insulating layer 30 interposed therebetween, and the conductor layer 44 is disposed above the signal line SL with the insulating layer 32 interposed therebetween.

As shown in FIG. 2, of the surfaces of the signal line SL, the bottom surface S1 is a roughened surface; however, the top surface S2 and the side surfaces S3, S4 are flat surfaces which are not roughened. The roughened bottom surface S1 is formed as a result of a process of roughening the surface of the insulating layer 30 and performing electroless plating on the surface. Thus, a satisfactory degree of adhesion is secured between the signal line layer 42 and the insulating layer 30 when the signal line layer 42 is patterned. Meanwhile, a silane coupling treatment using a silane coupling agent is performed on the top surfaces S2 and the side surfaces S3, S4, which are flat surfaces; i.e., on the patterned signal line layer 42, before formation of the insulating layer 32 on the signal line layer 42. This silane coupling treatment is an example of a surface modification treatment which is performed so as to secure the reliability of adhesion between the signal line layer 42 and the insulating layer 32, while maintaining the flat surfaces (without performing roughening treatment) so as to prevent an increase in conductor loss caused by the skin effect for high-frequency signals.

The silane coupling agent is an organic silane compound having an organic functional group in one molecule thereof, and can chemically bond a resin material, which is an organic substance, and a metallic material, which is an inorganic substance. The silane coupling treatment is performed as follows. After Sn plating is performed on the top surface S2 and side surfaces S3, S4 of the signal line SL shown in FIG. 2, the silane coupling agent is applied to these surfaces, and the insulating layer 32 is then formed. As result of performing the silane coupling treatment in this manner, a high degree of adhesion can be secured at the interface between the signal line layer 42 and the insulating layer 32 through the above-described chemical bonding. Since such a high degree of adhesion can be secured, it becomes possible to effectively prevent the occurrence of defects, such as partial surface bulging or separation, which would otherwise occur when the signal line layer 42 is heated, for example, at the time of re-flow.

Meanwhile, current which flows through the signal line SL of FIG. 2 as a result of transmission of a high-frequency signal concentrates at the vicinity of the conductor surface because of the skin effect. However, since each of the top surface S2 and side surfaces S3, S4 of the signal line SL is a flat surface and does not have an uneven portion as in the roughened surface, the conductor loss caused by the skin effect is small. Although the bottom surface S1 of the signal line SL is a roughened surface, an increase in conductor loss caused by the skin effect can be restrained, because only one of the four surfaces surrounding the signal line SL is a roughened surface and the remaining three surfaces are flat surfaces. However, the cross-sectional structure of the signal line SL is not limited to that shown in FIG. 2, and all the four surfaces surrounding the signal line SL may be flat surfaces having undergone a surface modification treatment, for example.

Preferably, the surface roughness Ra of the flat surfaces of each signal line SL of the signal line layer 42 is less than 0.1 μm. More particularly, the surface roughness Ra of the flat surfaces of each signal line SL is set to a value as close as possible to 0. Thus, the performance of each signal line SL for transmitting a high-frequency signal can be enhanced sufficiently. In contrast, as shown in FIG. 2, the surfaces of the conductor layers 40 and 44 disposed below and above the signal line layer 42 are roughened surfaces obtained through the roughening treatment. That is, the roughened surfaces are formed by etching the grain boundary regions of the surfaces of the conductor layers 40, 44. These roughened surfaces have a surface roughness Ra of about 1 μm. Since an anchor effect can be attained through such a roughening treatment, adhesion between the conductor layers 40, 44 and the insulating layers 30, 32, 34 is secured. Preferably, the surface roughness Ra of the roughened surfaces of the conductor layers 40 and 44 is set to fall within a range of 0.1 μm to 1 μm so as to secure adhesion between the conductor layers 40, 44 and the insulating layers 30, 32, 34.

The insulating layer 32 above the signal line layer 42 is not necessarily required to be formed of the same material as that of the insulating layers 30, 34 located below and above the insulating layer 32, respectively. The insulating layer 32 may be formed of a different material. Specifically, the insulating layer 32 is desirably formed of a material with a lower tan δ (electric loss tangent) and dielectric constant (relative dielectric constant) than the other insulating layers 30, 34. Through formation of the insulating layer 32 from such a material, the conductor loss of the signal line layer 42 decreases further, and the high-frequency characteristics can be improved further. Notably, each of the conductor layers 40, 44 has a sold conductor portion to be connected to a fixed potential such as power supply voltage or ground potential. Therefore, even if a material which has a relatively high tan δ and dielectric constant is used for the conductor layers 40, 44, the influence on the high-frequency characteristics is small.

Figure 3:
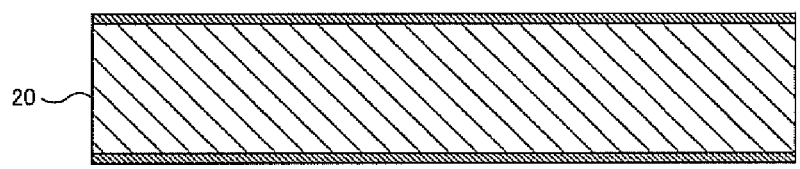
FIG. 3 is a first cross-sectional view showing a method of manufacturing the wiring substrate of the first embodiment.

Next, a method of manufacturing the wiring substrate 10 according to the first embodiment will be described with reference to FIGS. 3 to 7. First, as shown in FIG. 3, there is prepared a platelike substrate core 20 having copper foils bonded to opposite surfaces thereof. This substrate core 20 is formed of, for example, resin containing glass fibers, and has a high rigidity. In general, a square, platelike substrate core 20 having sides of about 300 mm is used in order to manufacture a plurality of wiring substrates 10 at a time. Notably, in FIGS. 3 to 7, for the purpose of simplification, a structure for manufacturing a single wiring substrate 10 is shown rather than a structure for manufacturing a plurality of wiring substrates.

Figure 4:
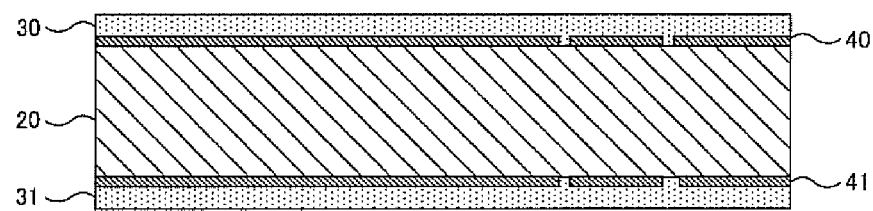
FIG. 4 is a second cross-sectional view showing the method of manufacturing the wiring substrate of the first embodiment.

Next, as shown in FIG. 4, a subtractive method is applied to the upper and lower copper foils of the substrate core 20 to thereby form conductor layers 40, 41 having predetermined patterns. The surfaces of the conductor layers 40, 41 are etched and roughened through use of a roughening agent such that the surfaces have a desired surface roughness Ra. Subsequently, a filmlike insulative resin material whose predominant component is epoxy is placed on each of the roughened surfaces of the conductor layers 40, 41, and is cured, whereby the insulating layers 30, 31 are formed.

Figure 5:
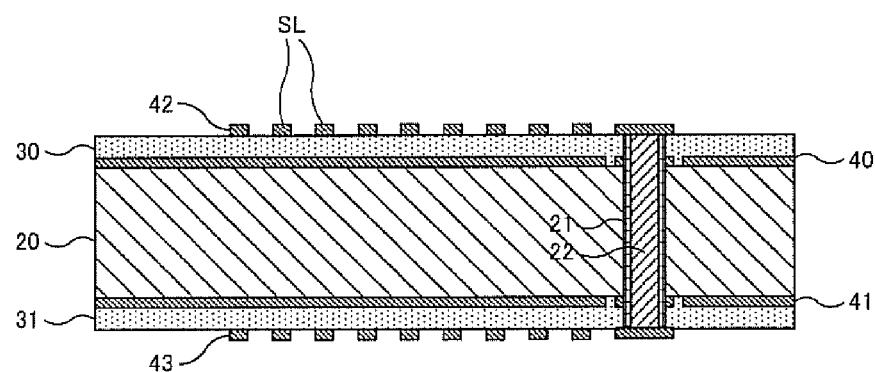
FIG. 5 is a third cross-sectional view showing the method of manufacturing the wiring substrate of the first embodiment.

Next, as shown in FIG. 5, by means of drilling performed through use of a drilling machine, a through hole is formed in the substrate core 20 and the insulating layer 30, 31 at a position where a through hole conductor 21 is to be formed. Electroless copper plating and electro copper plating are performed for the through hole. Thus, the through hole conductor 21 is formed. After that, paste whose predominant component is epoxy is charged into the cavity of the through hole conductor 21 by means of printing, and is cured, whereby a plug 22 is formed. Meanwhile, the surfaces of the insulating layers 30, 31 are roughened such that they have a desired surface roughness Ra. Next, electroless copper plating and electro copper plating are successively performed on the roughened surfaces of the insulating layers 30, 31, whereby a copper plating layer is formed on each of the roughened surfaces. Signal line layers 42, 43 having predetermined patterns are then formed through use of, for example, a semi-additive method. Subsequently, an Sn plating layer is formed on each of the signal line layers 42, 43 through Sn plating, and a silane coupling treatment using a silane coupling agent is applied thereto as described above. As a result, as shown in FIG. 2, the surfaces (excluding the bottom surface S1) surrounding each signal line SL of the signal line layers 42, 43 (i.e., the top surface S2 and the side surfaces S3, S4) become flat, and have a minimized roughness Ra.

Figure 6:
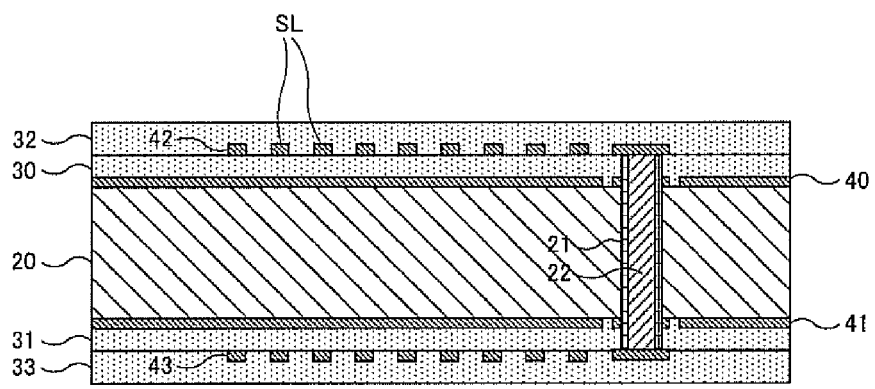
FIG. 6 is a fourth cross-sectional view showing the method of manufacturing the wiring substrate of the first embodiment.

Next, as shown in FIG. 6, a filmlike insulative resin material whose predominant component is epoxy is placed on the insulating layers 30, 31 and the flat surfaces of the signal line layers 42, 43 formed thereon, and is cured, whereby insulating layers 32, 33 are formed. As described above, the insulating layers 32, 33 are formed of a material which has a lower tan δ and relative dielectric constant than the insulating layers 30, 31 in order to further reduce the conductor loss of the signal line layers 42 and 43.

Figure 7:
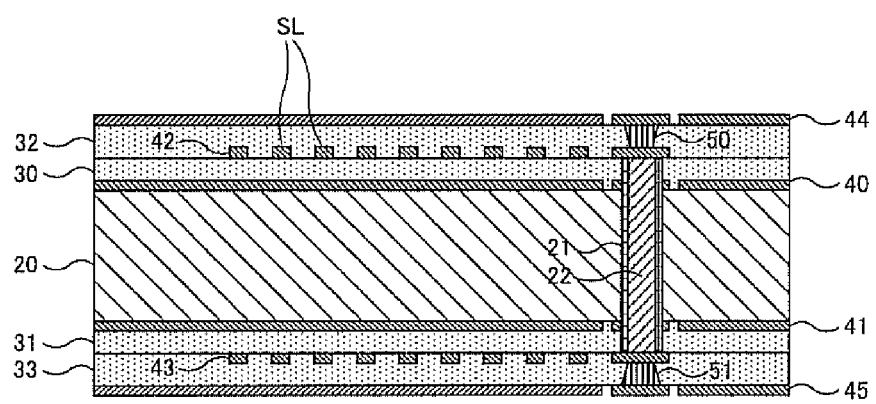
FIG. 7 is a fifth cross-sectional view showing the method of manufacturing the wiring substrate of the first embodiment.

Next, as shown in FIG. 7, laser machining is performed at predetermined positions on the insulating layers 32, 33 to thereby form via holes therein, and desmearing is performed so as to remove smear from the via holes. After that, via conductors 50, 51 are formed in the via holes. Subsequently, electroless copper plating and electro copper plating are successively performed on the surfaces of the insulating layers 32, 33, whereby a copper plating layer is formed on each of the surfaces. Conductor layers 44, 45 having predetermined patterns are then formed through use of, for example, a semi-additive method. The surfaces of the conductor layers 44, 45 are etched and roughened through use of a roughening agent such that the surfaces have a desired surface roughness Ra.

Next, referring back to FIG. 1, a filmlike insulative resin material whose predominant component is epoxy is placed on the roughened surfaces of the conductor layers 44, 45, and is cured, whereby insulating layers 34, 35 are formed. Subsequently, via conductors 52, 53 are formed in the insulating layers 34, 35 by use of the same method as that used for forming the via conductors 50, 51. Subsequently, electroless copper plating and electro copper plating are successively performed on the surfaces of the insulating layers 34, 35, whereby a copper plating layer is formed on each of the surfaces. A plurality of upper-side terminal pads 46 and a plurality of lower-side terminal pads 47 are then formed through use of, for example, a semi-additive method. Subsequently, a photosensitive resin is applied to the upper surface of the insulating layer 34 and the lower surface of the insulating layer 35, and is cured, whereby solder resist layers 36, 37 are formed. After that, openings are formed in the solder resist layer 36 on the upper side, and openings are formed in the solder resist layer 37 on the lower sides. Upon completion of the above-described process, the wiring substrate 10 shown in FIG. 1 is completed.

Figure 8:
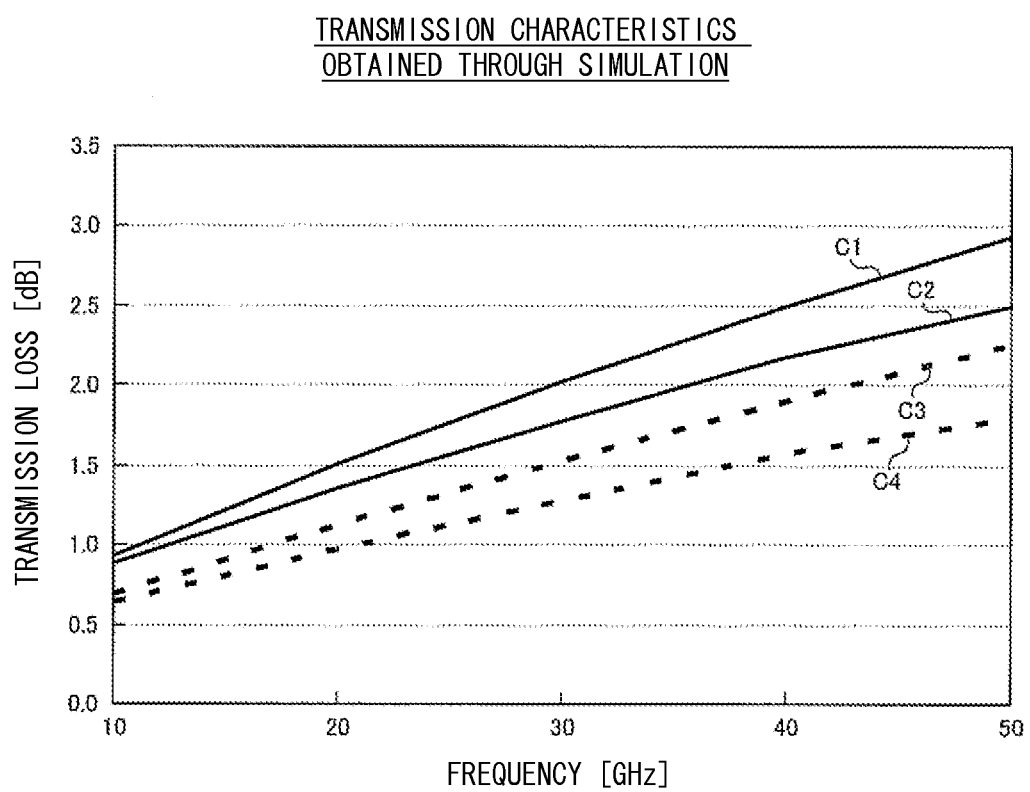
FIG. 8 is a graph showing the results of an evaluation of transmission characteristics for high-frequency signals which was performed by simulation for a signal line layer of the wiring substrate of the first embodiment.

Next, a specific effect regarding transmission characteristics associated with transmission of a high-frequency signal through the signal line layers 42, 43 of the wiring substrate 10 according to the first embodiment will be described with reference to FIGS. 8 and 9. FIG. 8 shows the results of evaluation of transmission characteristics for high-frequency signals which was performed through simulation for each signal line SL of the signal line layers 42, 43 of the wiring substrate 10 of the present embodiment. FIGS. 9A and 9B show a model of the signal line SL used for performance of the simulation, whose results are shown in FIG. 8. The graph of FIG. 8 shows four characteristics C1, C2, C3, C4 for comparison. The four characteristics C1, C2, C3, C4 are frequency characteristics of transmission loss of the signal line SL for four different combinations of two insulating materials A and B and two surface treatments (the conventional roughening treatment and the silane coupling treatment of the first embodiment).

Figure 9A:
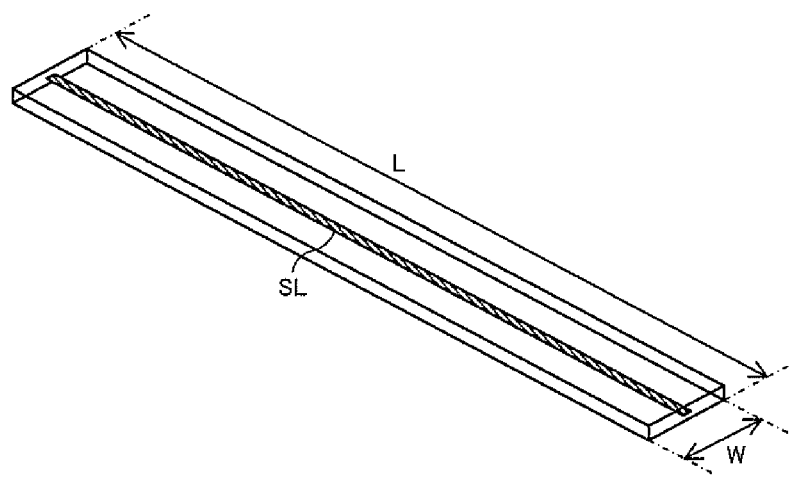
FIGS. 9A and 9B are views showing a model of a signal line used for performing the simulation, whose results are shown in FIG. 8.

As shown in the model of FIG. 9A, simulation was performed for an assumed area which includes a signal line SL and an insulating layer surrounding the signal line SL and which has a length L and a width W when viewed from above. Also, as shown in FIG. 9B, the signal line SL, which has a width W1 and a thickness T1 in an arbitrary cross section thereof, is surrounded by an insulating layer L1, and conductor layers L2, L3 are formed above and below the insulating layer L1. Since the distances between the signal line SL and the conductor layers L2, L3 are represented by thicknesses T2 and T3, respectively, the thickness of the insulating layer L1 is T1+T2+T3. Notably, the upper and lower conductor layers L2, L3 are assumed to be connected to a ground line.

Table 1 shows the specific conditions of the simulation associated with FIG. 8.

TABLE 1

Conditions of Simulation

| | | Characteristics | | | |
|---|---|---|---|---|---|
| | | C1 | C2 | C3 | C4 |
| Dimensions | L | | 5 mm | | |
| | W | | 0.6 mm | | |
| | W1 | | 32 μm | | |
| | T1 | | 15 μm | | |
| | T2 | | 33 μm | | |
| | T3 | | 33 μm | | |
| Frequency | | | 10 to 50 GHz | | |
| Characteristic impedance Zo | | | 50 Ω | | |
| Surface roughness Ra | | 0.8 μm | | 0.04 μm | |
| tanδ | | 0.019 | 0.007 | 0.019 | 0.007 |

Figure 9B:
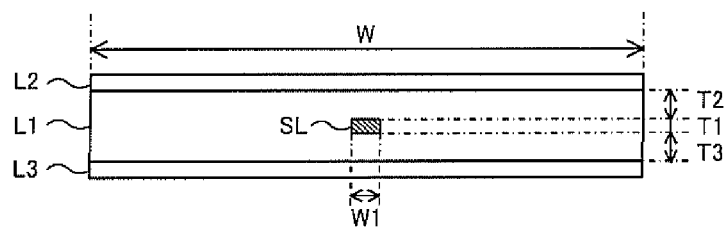

In Table 1, the dimensions shown in FIGS. 9A and 9B were set such that L=5 mm, W=0.6 mm, W1=32 μm, T1=15 μm, and T2=T3=33 μm. The frequency range of transmission signals was set to 10 to 50 GHz, and the characteristic impedance Zo of the transmission line was set to 50Ω. The surface roughness Ra of the signal line SL was set to 0.8 μm for the case of the characteristics C1 and C2 obtained through application of the conventional roughening treatment, and set to 0.04 μm for the case of the characteristics C3 and C4 obtained through application of the silane coupling treatment of the present embodiment. The tan δ (electric loss tangent) of the insulating layer L1 was set to 0.019 for the case of the characteristics C1 and C3 obtained through use of the material A, and set to 0.007 for the case of the characteristics C2 and C4 obtained through use of the material B. Notably, the signal line SL is assumed to be formed of copper having an electrical conductivity of 0.5 (S/m).

As shown in FIG. 8, the results of simulation of transmission characteristics performed under the conditions shown in Table 1 show that the transmission loss (S parameter S21) in the frequency range of 10 to 50 GHz decreases in the order of the characteristics C1, C2, C3, C4. That is, it was confirmed that, as compared with the characteristics C1, C2 obtained through application of the roughening treatment, the characteristics C3, C4 obtained through application of the silane coupling treatment of the first embodiment represent better high-frequency characteristics. Meanwhile, as is apparent from comparison between the characteristics C1 and C3 or the characteristics C2 and C4, it was confirmed that, as compared with the case where the material A having a large tan δ is used for the insulating layer L1 surrounding the signal line SL, better high-frequency characteristics are obtained in the case where the material B having a small tan δ is used for the insulating layer L1 surrounding the signal line SL. However, even in the case where the material A having a large tan δ is used, satisfactory high-frequency characteristics are expected when the silane coupling treatment of the first embodiment is applied (the characteristic C3). Therefore, even in such a case, the effect of the present invention is naturally attained.

Figure 10:
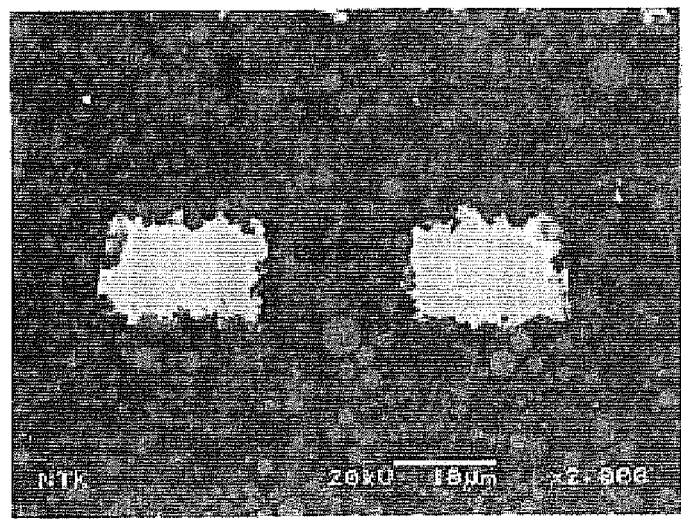
FIG. 10 is a photomicrograph of a cross section of a signal line layer showing two adjacent signal lines treated with a roughening treatment (comparative example)
Figure 11:
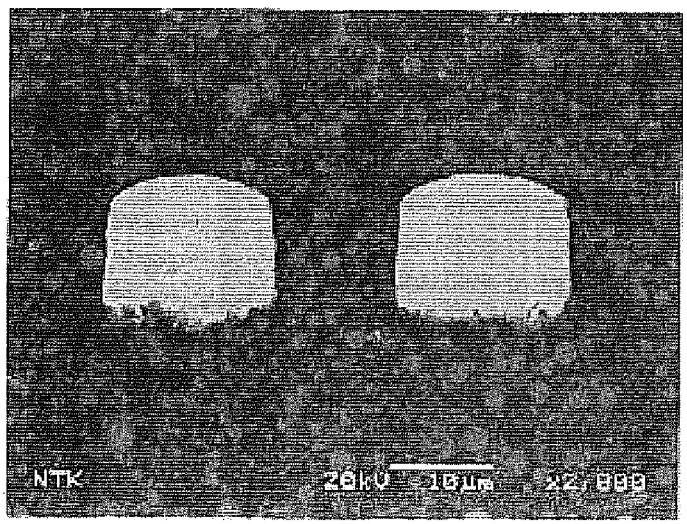
FIG. 11 is a photomicrograph of a cross section of the signal line layer showing two signal lines in the same region as in FIG. 10 treated with a silane coupling treatment of the first embodiment.

Next, the specific structure of the signal line SL of the first embodiment will be described. FIG. 10 shows, as a comparative example, a photomicrograph of a cross section of the signal line layer 42 (43) for the case where adjacent two signal lines SL were treated by the roughening treatment rather than the silane coupling treatment for comparison with the first embodiment. Meanwhile, FIG. 11 shows a photomicrograph of a cross section of the signal line layer 42 (43) for the case where the silane coupling treatment of the first embodiment was performed for adjacent two signal lines SL in the same area as that of FIG. 10. As is apparent from FIGS. 10 and 11, the signal lines SL of the first embodiment have flat surfaces that correspond to the top surface S2 and the side surfaces S3, S4 shown in FIG. 2. When a reflow endurance test was performed for wiring substrates 10 having the structures of FIGS. 10 and 11, respectively, it was confirmed that the structures of FIGS. 10 and 11 have the same degree of defects such as partial bulging and separation of the signal line layer 42 (43).

Figure 12:
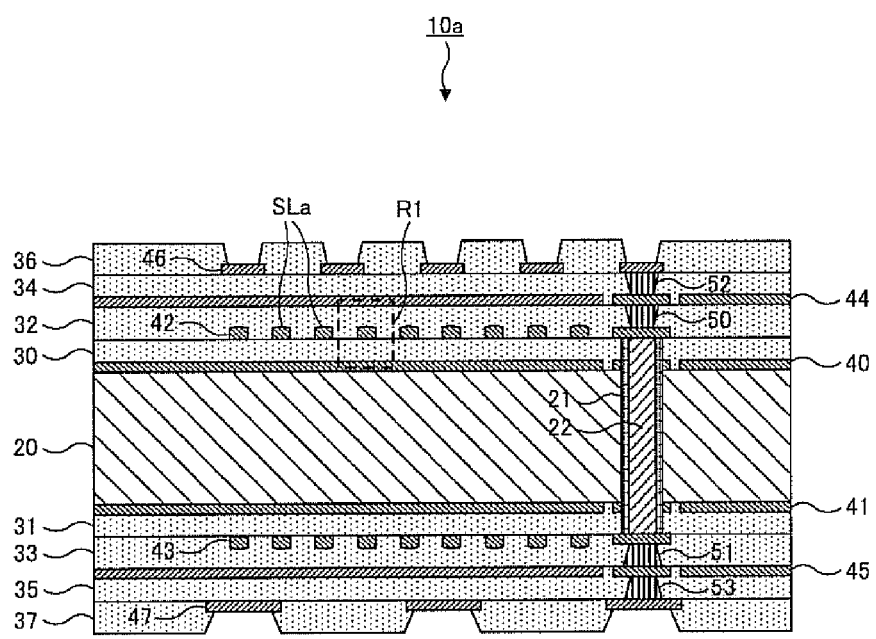
FIG. 12 is a schematic view showing a cross-section of a wiring substrate of a second embodiment.
Figure 13:
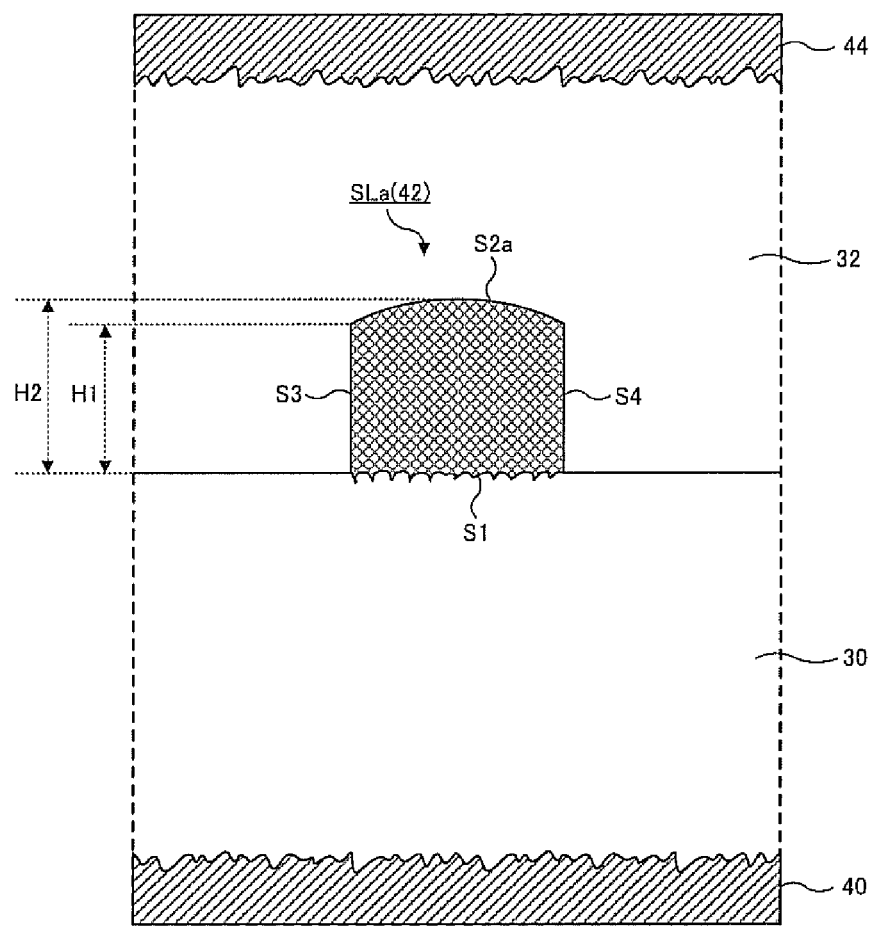
FIG. 13 is an enlarged schematic view showing a portion of the cross-section shown in FIG. 12 that includes one signal line of a signal line layer.

The structure of a wiring substrate according to a second embodiment of the present invention will be described. FIG. 12 schematically shows the cross-sectional structure of the wiring substrate 10a of the second embodiment. Although the wiring substrate 10a of the second embodiment has a cross-sectional structure substantially the same as that of the wiring substrate 10 of the first embodiment shown in FIG. 1, the wiring substrate 10a differs from the wiring substrate 10 in the cross-sectional structure of signal lines SLa of the signal line layer 42. Since the structure shown in FIG. 12 other than the signal lines SLa is the same as that of the first embodiment, its description will not be repeated, and only the difference will be described. FIG. 13 is an enlarged view schematically showing a partial region R1 (at the same position as the region R1 of FIG. 1) of the cross-sectional structure shown in FIG. 12, which includes one signal line SLa of the signal line layer 42.

The structures and arrangements of the upper-side and lower-side insulating layers 30, 32 and the upper-side and lower-side conductor layers 40, 44 of FIG. 13 are the same as those of the first embodiment shown in FIG. 2. Also, the present embodiment is identical with the first embodiment in that, of the surfaces surrounding the signal line SLa, the bottom surface S1 is roughened, and the top surface S2a and the side surfaces S3, S4 are not roughened. Meanwhile, as shown in FIG. 13, in the second embodiment, the signal line SLa has a curved (e.g., convex) cross section such that a central portion of the top surface S2a of the signal line SLa projects upward in relation to the edge portions thereof, rather than having a cross sectional shape such that the top surface extends straight shown in FIG. 2. That is, the thickness of the signal line SLa at the center is greater than those at the edges. Notably, in the second embodiment, a surface modification treatment is performed on the side surfaces S3, S4 and the top surface S2a. Therefore, the second embodiment provides the same effect as that of the first embodiment (i.e., can secure adhesion between the signal line SLa and the insulating layer 32) and can restrain an increase in the conductor loss produced at the signal line S2a due to the skin effect.

Since the signal line SLa has a curve cross-sectional shape such that the top surface S2a of the signal line SLa projects upward as shown in FIG. 13, concentration of stress at a corner portion of the signal line SLa can be mitigated. That is, the signal line SLa, which is formed of a metallic material, is surrounded by the insulating layers 30, 32 formed of a resin material, and thermal stress acts on the signal line SLa due to a difference in coefficient of thermal expansion therebetween. Since this thermal stress concentrates on corner portions of the cross-sectional structure of the signal line SLa where the top surface S2a perpendicularly intersects the side surfaces S3, S4, resin cracking may occur near the corner portions. In the second embodiment, the top surface S2a having a convex cross section is formed in a plating step to be described later, whereby opposite corner portions have obtuse angles greater than a right angle, to thereby mitigate concentration of stress at the corner portions.

FIG. 13 shows the heights H1 and H2 of the signal line SLa. That is, as viewed in a cross section of the signal line SLa, the height H1 from the bottom surface S1 to the edges of the top surface S2$a$ and the height H2 from the bottom surface S1 to the center portion of the top surface S2$a$ satisfy a relation H1<H2. A roundness is defined on the basis of the heights H1 and H2 of the signal line SLa as (H2−H1)/H2. In general, the greater the roundness, the greater the obtuse angles of the corner portions of the signal line SLa. However, a proper roundness must be set in consideration of the composition of a chemical used in the plating step to be described later, the cross sectional area of the signal line SLa, etc. Notably, a specific method of forming the signal line SLa of FIG. 13 will be described later.

As described above, through employment of the structure of the second embodiment, it becomes possible to not only attain the same effect as that of the first embodiment, but also enhance reliability by preventing resin cracking, etc., caused by concentration of stress at the signal line SLa. In the above-described example, the structure of the second embodiment is applied to the signal line SLa. However, a wiring layer other than the signal line SLa (the first conductor layer of the present invention) may be formed to have a cross-sectional shape shown in FIG. 13 so as to mitigate stress concentration. Notably, even in the second embodiment, preferably, the surface roughness Ra of the unroughened surfaces of the signal line SLa are set to be less than 0.1 μm as in the case of the first embodiment. Also, the insulating layer 32 above the signal line layer 42 may be formed of a material different from the material of the insulating layers 30, 34 located below and above the insulating layer 32, respectively, as in the case of the first embodiment. Preferably, the insulating layer 32 is formed through use of, for example, a material that has a relatively small tan δ (electric loss tangent) and dielectric constant (relative dielectric constant).

Next, there will be described a method of manufacturing the wiring substrate 10$a$ of the second embodiment. Since many steps of the method of manufacturing the wiring substrate 10$a$ of the second embodiment are identical with those of the manufacturing method of the first embodiment (FIGS. 3 to 7), the different points will be mainly described below. First, conductor layers 40, 41 and insulating layers 30, 31 are formed on a substrate core 20 through the steps described with reference to FIGS. 3 and 4, and a through hole conductor 21 filled with a plug 22 is formed. Subsequently, electroless copper plating and electro copper plating are successively performed on the roughened surfaces of the insulating layers 30, 31 to thereby form a copper plating layer (plating step), and signal line layers 42, 43 having predetermined patterns are formed through use of, for example, a semi-additive method. The feature of the second embodiment resides in that copper sulfate is used as a chemical for electro copper plating in the plating step.

Figure 14:
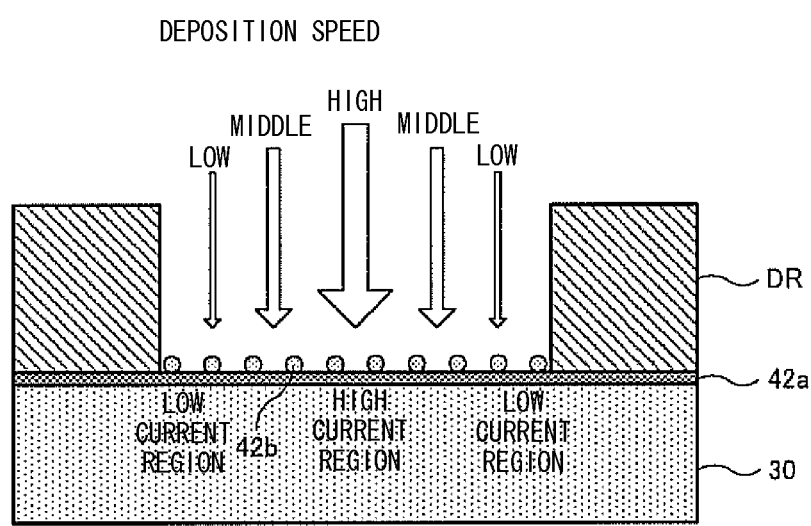
FIG. 14 is a view showing the action of electro copper plating performed through use of copper sulfate in the second embodiment.

Here, the action of electro copper plating performed through use of copper sulfate will be described with reference to FIG. 14. FIG. 14 shows a state in which electro copper plating is performed through use of copper sulfate after performance of electroless copper plating on the insulating layer 30. Specifically, an electroless copper plating film 42$a$, which serves as a substrate for the conductor layer 42 is formed on the insulating layer 30, and a plating resist layer DR having a predetermined pattern is formed on the plating film 42$a$. The wiring substrate in this state is placed in a plating bath filled with a plating solution containing copper sulfate, whereby a plating pattern is deposited. At that time, the deposition speed changes depending on the position in a deposition region 42$b$ of FIG. 14; that is, the deposition speed is high at a central region (large current region), and the deposition speed is low at edge regions (small current regions). As a result, upon completion of the plating step, a signal line SLa having a cross-sectional shape as shown in FIG. 13 is formed.

When the electro copper plating shown in FIG. 14 is performed, the above-described roundness of the cross-sectional shape of the signal line SLa changes depending on the copper sulfate concentration of plating solution. That is, when the copper sulfate concentration increases, the Cu ion supply amount in the central region of the deposition region 42$b$ tends to increase as compared with those at the edge regions. Therefore, by performing electro copper plating while sufficiently increasing the copper sulfate concentration of the plating solution, the above-described roundness of the cross-sectional shape of the signal line SLa can be increased. However, it is noted that, when the copper sulfate concentration of the plating solution is increased excessively, it becomes difficult to dissolve copper sulfate into the plating solution. Specifically, by means of adjusting the copper sulfate concentration within a range in which copper sulfate can be dissolved into the plating solution, such as about 120 to 200 g/L, there can be formed a signal line SLa whose cross-sectional shape is rounded to such a degree that stress concentration can be mitigated. Notably, a chemical other than copper sulfate may be used as the plating solution insofar as the plating solution can form the cross-sectional shape of the signal line SLa through the action described with reference to FIG. 14.

In subsequent manufacturing steps, in accordance with the same procedure as that of the first embodiment, a surface modification treatment such as silane coupling treatment is performed on the signal line layers 42, 43; and, after that, insulating layers 32, 33, via conductors 50, 51, conductor layers 44, 45, insulating layers 34, 35, via conductors 52, 53, a plurality of terminal pads 46, 47, and solder resist layers 36, 37 are formed in this sequence. As a result, the wiring substrate 10$a$ shown in FIG. 12 is completed.

In order to check the effect of the second embodiment, a reliability test was performed for the wiring substrate 10$a$ manufactured through the above-described manufacturing steps. Specifically, a thermal shock test including 1000 heat cycles (temperature range: −65 to 150° C.) was performed for ten wiring substrates having the same structure as that of the wiring substrate 10$a$, and the ten wiring substrates were checked for generation of resin cracking. The results of the thermal shock test demonstrate that in the case of ten wiring substrates which did not have the cross-sectional shape of the signal line SLa of the second embodiment, resin cracking occurred in eight of the ten wiring substrates. In contrast, in the case of ten wiring substrates which had the cross-sectional shape of the signal line SLa of the second embodiment, no resin cracking occurred in the ten wiring substrates. As described above, it was confirmed that, through employment of the structure of the second embodiment, generation of resin cracking, etc., can be prevented, whereby high reliability can be attained.

Notably, in the case where the wiring substrates 10, 10$a$ of the first and second embodiments are used for transmission of high-frequency signals, the above-described signal lines SL, SLa are desirably configured as a microstrip line. In such a case, any of many structures may be employed. For example, in the structure shown in FIG. 9B, the width W1 and the thicknesses T1, T2, T3 may be optimized in accordance with the transmission frequency. Through use of such a microstrip line, the transmission characteristics of the wiring substrates 10, 10a for high-frequency signals can be improved further.

In the above, the present invention has been described specifically on the basis of the first and second embodiments; however, the present invention is not limited to these embodiments, and may be modified in various manners without departing from the scope of the invention. For example, the wiring substrate 10 (10a) of the above-described embodiments includes a substrate core 20 for supporting the entire wiring substrate. However, the present invention can be applied to various wiring substrates which do not include the substrate core 20, insofar as the wiring substrates have a structure in which insulating layers and conductor layers are alternately stacked. Also, the wiring substrate 10 (10a) of the above-described embodiments includes two signal line layers 42, 43 having the cross-sectional structure shown in FIG. 2. However, the number of such signal line layers is not limited to two, and a single or three or more signal line layers may have a structure similar to that of the signal line layers 42, 43. Moreover, in the wiring substrate 10 (10a) of the above-described embodiments, the silane coupling treatment is performed on the signal line layers 42, 43. However, the surface modification treatment is not limited to the silane coupling treatment, and the effect of the present invention can be attained even when any other surface modification treatments which provides a similar effect is performed. As to other points, the above-described embodiments do not limit the scope of the present invention. The present invention can be changed freely, without being limited to the details of the above-described embodiments, so long as the actions and effects of the present invention are attained.

DESCRIPTION OF REFERENCE NUMERALS 10, 10a: wiring substrate
20: substrate core
21: through hole conductor
22: plug
30, 31, 32, 33, 34, 35: insulating layer
36, 37: solder resist layer
40, 41, 44, 45: conductor layer
42, 43: signal line layer
46, 47: terminal pad
50, 51, 52, 53: via conductor
SL, SLa: signal line

The invention claimed is:

1. A wiring substrate, comprising:
a laminate portion including insulating layers and conductor layers stacked alternately; wherein
at least one of the conductor layers is a signal line layer, through which a signal is to be transmitted, comprising a flat surface having undergone a surface modification treatment; and
each of the conductor layers other than the signal line layer comprise a roughened surface.

2. A wiring substrate according to claim 1, wherein the surface modification treatment is a silane coupling treatment using a silane coupling agent.

3. A wiring substrate according to claim 1, wherein a surface of the signal line layer in contact with an insulating layer which is adjacently located on a first side of the signal line layer is not the flat surface, and a surface of the signal line layer in contact with an insulating layer which is adjacently located on a second side of the signal line layer is the flat surface.

4. A wiring substrate according to claim 1, wherein the flat surface of the signal line layer has a surface roughness of less than 0.1 μm, and the roughened surface of each of the conductor layers other than the signal line layer has a surface roughness of 0.1 μm or greater.

5. A wiring substrate according to claim 1, wherein the insulating layers adjacent to the signal line layer are smaller in relative dielectric constant than the remaining insulating layer(s).

6. A wiring substrate according to claim 1, further comprising:
a substrate core, wherein the laminate portion is formed on each of opposite sides of the substrate core; and
first and second signal line layers disposed in the respective laminate portions, wherein the substrate core intervenes between the first and second signal line layers.

7. A wiring substrate according to claim 1, wherein the signal line layer is configured as a microstrip line.

8. A method of manufacturing a wiring substrate including a laminate portion including insulating layers and conductor layers stacked alternately, the method comprising:
a first conductor layer forming step of forming, on a surface of a first insulating layer of the laminate portion, a first conductor layer that is a signal line layer through which a signal is to be transmitted;
a surface modification step of performing a surface modification treatment on the first conductor layer that is the signal line layer such that the signal line layer has a flat surface;
an insulating layer forming step of forming a second insulating layer which covers an upper portion of the signal line layer;
a second conductor layer forming step of forming a second conductor layer of the laminate portion; and
a roughening step of performing a roughening treatment on surfaces of the second conductor layer.

9. A method of manufacturing a wiring substrate according to claim 8, wherein the surface modification treatment is a silane coupling treatment that uses a silane coupling agent and forms the flat surface.

10. A wiring substrate, comprising:
a laminate portion composed of insulating layers and conductor layers stacked alternately; wherein
at least one of the conductor layers is a first conductor layer that is a signal line layer through which a signal is to be transmitted, the first conductor layer that is a signal line layer comprising an unroughened surface having undergone a surface modification treatment; and
each of the conductor layers other than the first conductor layer comprises a roughened surface,
wherein the cross-sectional shape of the first conductor layer has a curved portion such that a central portion of an upper surface of the first conductor layer projects upward in relation to edge portions thereof.

11. A wiring substrate according to claim 10, wherein the surface modification treatment is a silane coupling treatment using a silane coupling agent.

12. A wiring substrate according to claim 10, wherein the unroughened surface of the first conductor layer has a surface roughness of less than 0.1 μm, and the roughened surface of each of the conductor layers other than the first conductor layer has a surface roughness of 0.1 μm or greater.

13. A wiring substrate according to claim 10, wherein the insulating layers adjacent to the first conductor layer are smaller in relative dielectric constant than the remaining insulating layer(s).

14. A wiring substrate according to claim 10, wherein the signal line layer is configured as a microstrip line.

15. A method of manufacturing a wiring substrate including a laminate portion including insulating layers and conductor layers stacked alternately, the method comprising:
- a first conductor layer forming step of forming, on a surface of a first insulating layer of the laminate portion, a first conductor layer that is a signal line layer through which a signal is to be transmitted;
- a surface modification step of performing a surface modification treatment on the first conductor layer so as to form an unroughened surface thereon;
- an insulating layer forming step of forming a second insulating layer which covers an upper portion of the first conductor layer;
- a second conductor layer forming step of forming a second conductor layer of the laminate portion; and
- a roughening step of performing a roughening treatment on surfaces of the second conductor layer,
- wherein the first conductor layer forming step includes a plating step of performing electro copper plating using copper sulfate on the surface of the first insulating layer to thereby form the first conductor layer whose cross-sectional shape has a curved portion such that a central portion of an upper surface of the first conductor layer projects upward in relation to edge portions thereof.

* * * * *